United States Patent
Hu et al.

(10) Patent No.: US 7,404,433 B1
(45) Date of Patent: Jul. 29, 2008

(54) LIQUID COOLED HEAT SINK

(75) Inventors: Jen-Lu Hu, Tainan (TW); Hao-Hui Lin, Taitung (TW); Tsung-Ching Sun, Tainan (TW)

(73) Assignee: Man Zai Industrial Co., Ltd., Tainan (TW)

( * ) Notice: Subject to any disclaimer, the term of this patent is extended or adjusted under 35 U.S.C. 154(b) by 7 days.

(21) Appl. No.: 11/701,293

(22) Filed: Jan. 31, 2007

(51) Int. Cl.
*H05K 7/20* (2006.01)
(52) U.S. Cl. .................. 165/80.4; 165/104.33; 361/699
(58) Field of Classification Search ............... 165/80.4, 165/104.33; 361/699
See application file for complete search history.

(56) References Cited

U.S. PATENT DOCUMENTS

| | | | | |
|---|---|---|---|---|
| 5,316,077 | A * | 5/1994 | Reichard | 165/104.28 |
| 6,019,165 | A * | 2/2000 | Batchelder | 165/80.3 |
| 6,529,377 | B1 * | 3/2003 | Nelson et al. | 361/699 |
| 7,156,160 | B2 * | 1/2007 | Lee et al. | 165/104.33 |
| 7,255,154 | B2 * | 8/2007 | Koga et al. | 165/104.33 |
| 7,325,591 | B2 * | 2/2008 | Duan et al. | 165/104.33 |
| 2004/0052049 | A1 * | 3/2004 | Wu et al. | 361/699 |
| 2004/0052663 | A1 * | 3/2004 | Laing et al. | 417/423.8 |
| 2004/0240179 | A1 * | 12/2004 | Koga et al. | 361/699 |
| 2005/0243518 | A1 * | 11/2005 | Hata et al. | 361/699 |
| 2006/0237172 | A1 * | 10/2006 | Lo | 165/125 |
| 2007/0107880 | A1 * | 5/2007 | Hong et al. | 165/104.33 |
| 2007/0263354 | A1 * | 11/2007 | Crocker et al. | 361/699 |

FOREIGN PATENT DOCUMENTS

JP     2002094276 A  *  3/2002

* cited by examiner

*Primary Examiner*—Allen J Flanigan
(74) *Attorney, Agent, or Firm*—DLA Piper US LLP

(57) ABSTRACT

A liquid cooled heat sink includes: a casing defining an inner space and provided with a partitioning wall dividing the inner space into upper and lower chambers and formed with a fluid passage in fluid communication with the upper and lower chambers, the casing being formed with a fluid inlet in fluid communication with the upper chamber and adapted to be connected to an external cooling device; a fin unit provided in the lower chamber; and a pump mounted on the casing and having a suction end disposed in the upper chamber, extending through the partitioning wall, and in fluid communication with the lower chamber, and a discharging end disposed in the upper chamber and adapted to be connected to an external cooling device.

2 Claims, 3 Drawing Sheets

LIQUID COOLED HEAT SINK

BACKGROUND OF THE INVENTION

1. Field of the Invention

The invention relates to a liquid cooled heat sink, more particularly to a liquid cooled heat sink including a casing and a pump mounted directly on the casing and in fluid communication with a lower chamber in the casing.

2. Description of the Related Art

As shown in FIG. 1, a conventional heat dissipating device generally includes a radiator 2 having a fluid inlet 22 and a fluid outlet 21, a heat sink 11 having a coolant inlet 111 and a coolant outlet 112, an inlet conduit 12, an outlet conduit 13, and a pump 14. The heat sink 11 is adapted to be connected to a heat source (not shown), such as a CPU or a heat-generating electronic component of a display. The outlet conduit 13 interconnects the coolant outlet 112 of the heat sink 11 and the fluid inlet 22 of the radiator 2. The pump 14 is mounted on the inlet conduit 12, and the inlet conduit 12 has a first conduit section 121 interconnecting the coolant inlet 111 of the heat sink 11 and the pump 14, and a second conduit section 122 interconnecting the pump 14 and the fluid outlet 21 of the radiator 2.

When the pump 14 is operated, a coolant is driven to circulate through the heat sink 11, the outlet conduit 13, the radiator 2, and the inlet conduit 12, and carries heat absorbed by the heat sink 11 to the radiator 2 so as to dissipate heat thereat.

Although the conventional heat dissipating device has the heat dissipating effect, there are still some disadvantages:

1) An undesired high coolant vaporizing rate due to connection between the pump 14 and the first and second conduit sections 121, 122 of the inlet conduit 12 occurs.

2) A larger space is required to accommodate the pump 14 and the first and second conduit sections 121, 122 of the inlet conduit 12.

3) Assembly of the pump 14 and the first and second conduit sections 121, 122 of the inlet conduit 12 is inconvenient when the space for accommodating the heat dissipating device is small.

SUMMARY OF THE INVENTION

Therefore, the object of the present invention is to provide a liquid cooled heat sink that can overcome the aforesaid disadvantages associated with the prior art.

Accordingly, a liquid cooled heat sink of the present invention is adapted to be attached to an electronic component and comprises: a casing defining an inner space and provided with a partitioning wall that divides the inner space into upper and lower chambers, the partitioning wall being formed with a fluid passage in fluid communication with the upper and lower chambers, the casing being formed with a fluid inlet that is in fluid communication with the upper chamber and that is adapted to be connected to an external cooling device; a fin unit provided in the lower chamber; and a pump mounted on the casing and having a suction end disposed in the upper chamber, extending through the partitioning wall, and in fluid communication with the lower chamber for withdrawing fluid from the lower chamber, and a discharging end disposed in the upper chamber and adapted to be connected to a connecting pipe for discharging the fluid from the lower chamber into the external cooling device so as to circulate the fluid through the upper and lower chambers and the external cooling device.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
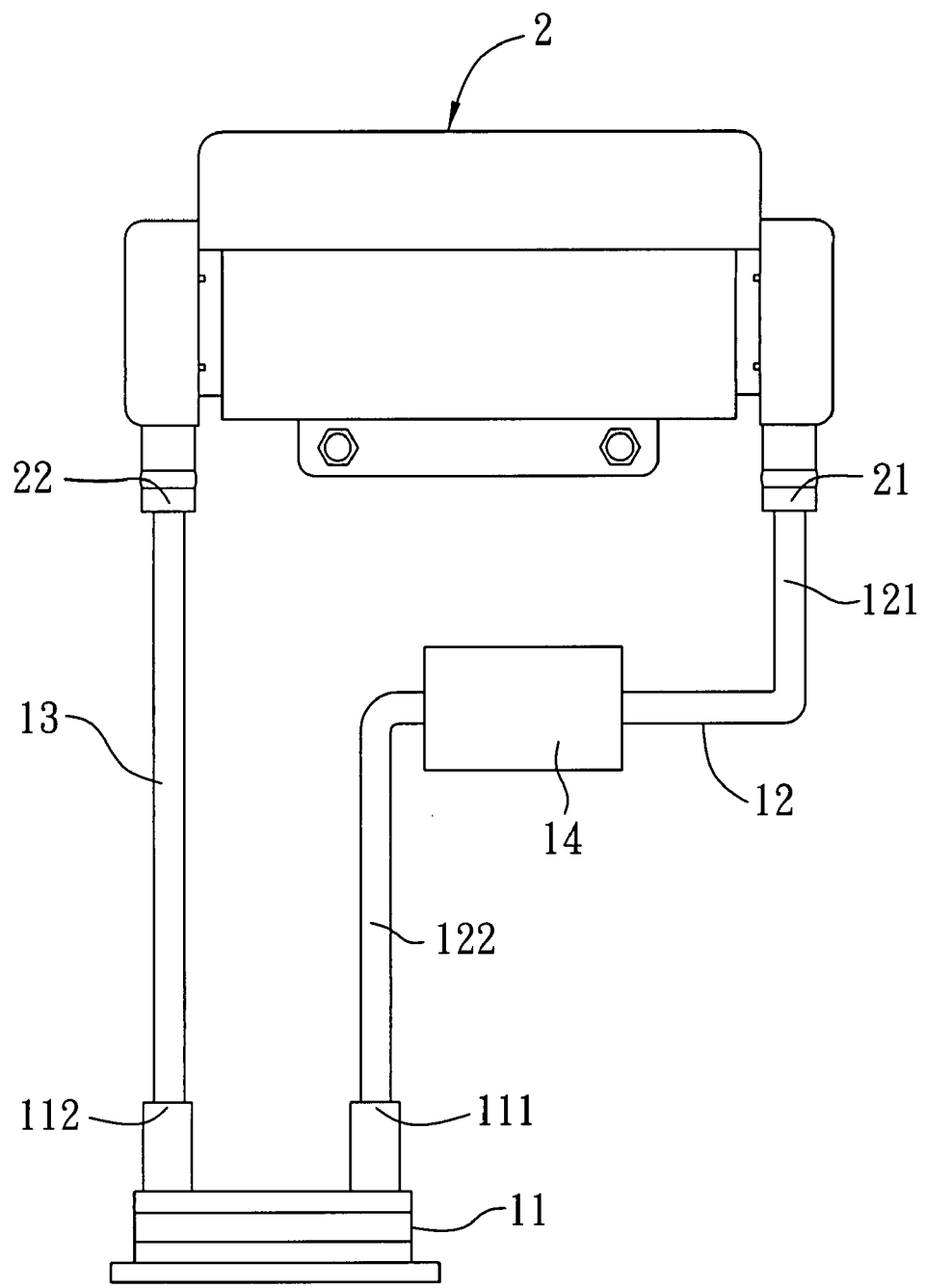
FIG. 1 is a schematic view of a conventional heat dissipating device.
Figure 2:
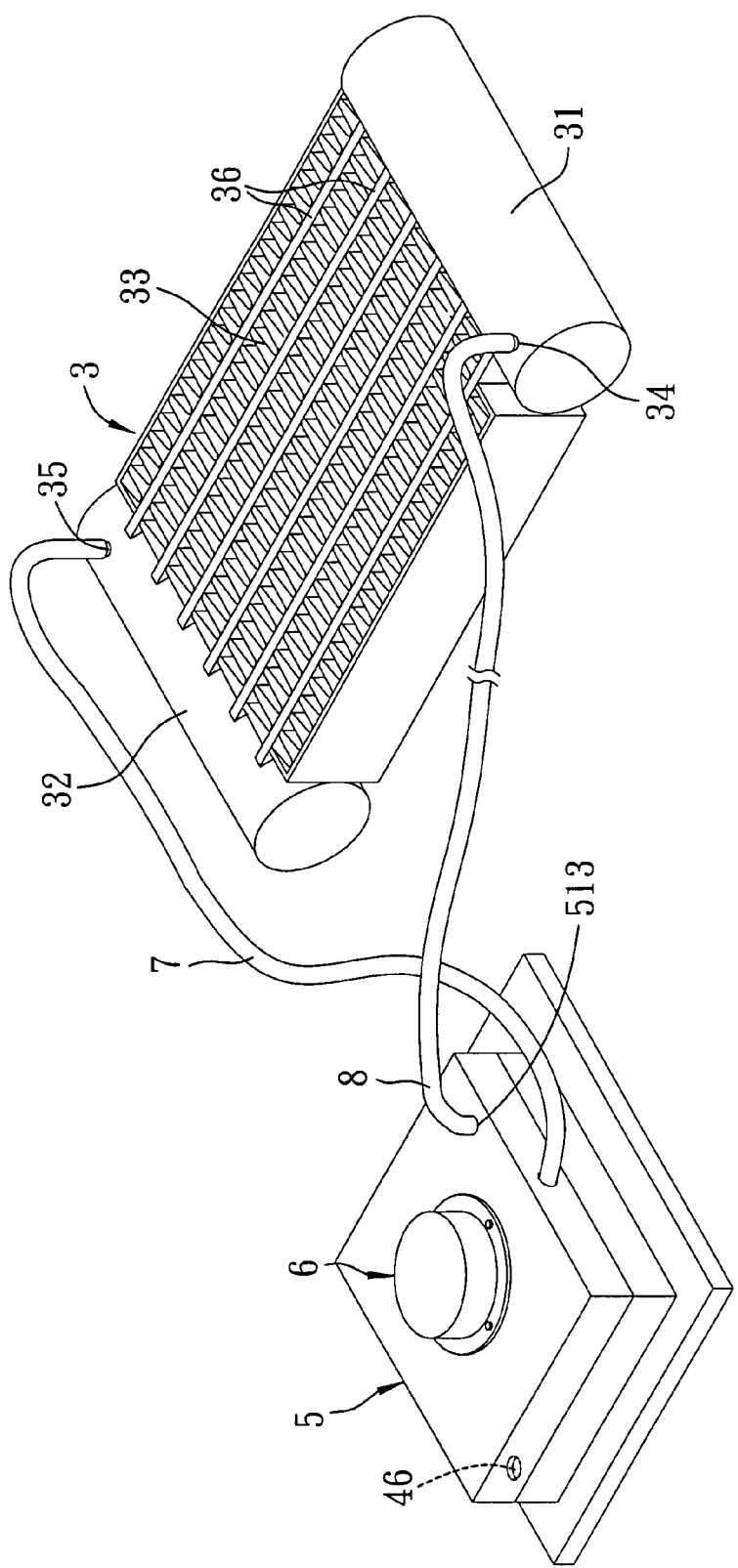
FIG. 2 is a fragmentary perspective view of the preferred embodiment of a heat dissipating assembly according to the present invention.
Figure 3:
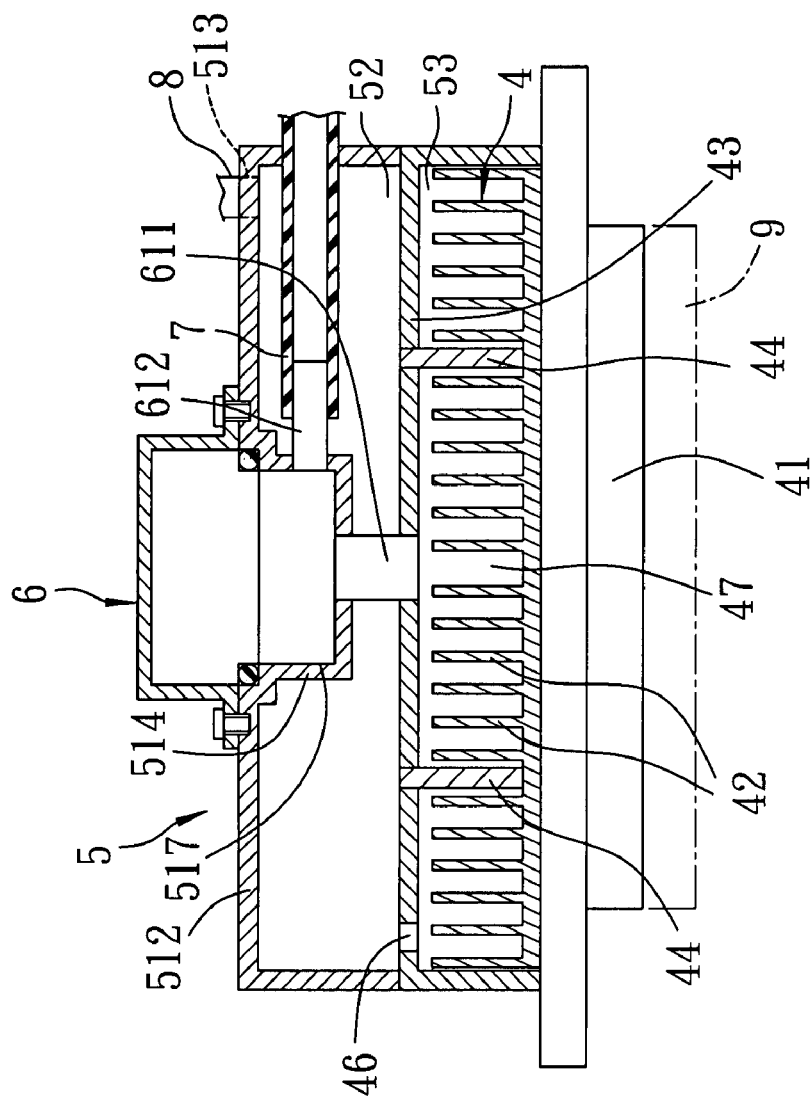
FIG. 3 is a fragmentary sectional view of a heat sink of the preferred embodiment.

Referring to FIGS. 2 and 3, the preferred embodiment of a heat dissipating assembly according to the present invention is shown to includes a liquid cooled heat sink and an external cooling device 3 connected to the liquid cooled heat sink.

The liquid cooled heat sink is adapted to be attached to an electronic component 9, and includes: a casing 5 defining an inner space and provided with a partitioning wall 43 that divides the inner space into upper and lower chambers 52, 53, the partitioning wall 43 being formed with a fluid passage 46 in fluid communication with the upper and lower chambers 52, 53, the casing 5 being formed with a fluid inlet 513 that is in fluid communication with the upper chamber 52 and that is adapted to be connected to the external cooling device 3 through a first conduit 8; a fin unit 42 provided in the lower chamber 53; and a pump 6 mounted directly on the casing 5 and having a suction end 611 disposed in the upper chamber 52, extending through the partitioning wall 43, and in fluid communication with the lower chamber 53 for withdrawing a coolant from the lower chamber 53, and a discharging end 612 disposed in the upper chamber 52 and adapted to be connected to the external cooling device 3 through a second conduit 7 for discharging the coolant from the lower chamber 53 into the external cooling device 3 so as to circulate the coolant through the upper and lower chambers 52, 53 and the external cooling device 3.

In this embodiment, the casing 5 has a top wall 512 and a bottom wall that is formed with an attaching protrusion 41 adapted to be attached to the electronic component 9. The top wall 512 is formed with a recess 517 defined by a recess-defining wall 514. The pump 6 is mounted on the top wall 512, and extends into the recess 517. The suction end 611 of the pump 6 extends through the recess-defining wall 514 into the upper chamber 52.

The external cooling device 3 is in the form of a radiator that is made from metal and that includes first and second side tanks 31, 32 adapted to store the coolant therein, a plurality of connecting conduits 36 interconnecting and in fluid communication with the first and second side tanks 31, 32, and a fin structure 33 connected to the connecting conduits 36 and the first and second side tanks 31, 32. The first side tank 31 has a coolant outlet 34 that is connected to the fluid inlet 513 of the heat sink through the first conduit 8. The second side tank 32 has a coolant inlet 35 that is connected to the discharging end 612 of the pump 6 through the second conduit 7.

The casing 5 is made from a metal material with good heat conducting property, and further includes a plurality of dividing walls 44 extending between the partitioning wall 43 and the bottom wall of the casing 5 so as to form the lower chamber 53 into a tortuous fluid path 47 for flowing of the coolant therethrough before entering into the pump 6.

Before use, the coolant is filled in the first and second side tanks 31, 32, the connecting conduits 36, the first and second conduits 8, 7, and the upper and lower chambers 52, 53 in the casing. In use, the pump 6 is started so that the coolant in the external cooling device 3 is pumped through the first conduit 8 into the upper chamber 52 in the casing 5 of the heat sink for heat exchange with the electronic component 9. Thereafter, the heated coolant flows in sequence through the second conduit 7, the second side tank 32, the connecting conduits 36, and the first side tank 31. As the coolant flows through the connecting conduits 36, the fin structure 33 absorbs and dissipates heat thereat so that the coolant is cooled down before flowing into the first side tank 31.

By mounting the pump 6 directly on the casing 5 of the liquid cooled heat sink of this invention, the aforesaid drawbacks associated with the prior art can be eliminated.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A liquid cooled heat sink adapted to be attached to an electronic component, said liquid cooled heat sink comprising:

- a casing defining an inner space and provided with a partitioning wall that divides said inner space into upper and lower chambers, said partitioning wall being formed with a fluid passage in fluid communication with said upper and lower chambers, said casing being formed with a fluid inlet that is in fluid communication with said upper chamber and that is adapted to be connected to an external cooling device;
- a fin unit provided in said lower chamber; and
- a pump mounted on said casing and having a suction end disposed in said upper chamber, extending through said partitioning wall, and in fluid communication with said lower chamber for withdrawing fluid from said lower chamber, and a discharging end disposed in said upper chamber and adapted to be connected to a connecting pipe for discharging the fluid from said lower chamber into the external cooling device so as to circulate the fluid through said upper and lower chambers and the external cooling device.

2. The liquid cooled heat sink as claim in claim 1, wherein said casing has a top wall and a bottom wall that is formed with an attaching protrusion adapted to be attached to the electronic component, said top wall being formed with a recess defined by a recess-defining wall, said pump being mounted on said top wall and extending into said recess, said suction end of said pump extending through said recess-defining wall.

* * * * *